United States Patent [19]
Norton et al.

[11] Patent Number: 5,177,580
[45] Date of Patent: Jan. 5, 1993

[54] IMPLANT GUARDED MESA HAVING IMPROVED DETECTOR UNIFORMITY

[75] Inventors: Paul R. Norton; William A. Radford, both of Santa Barbara, Calif.

[73] Assignee: Santa Barbara Research Center, Goleta, Calif.

[21] Appl. No.: 643,401

[22] Filed: Jan. 22, 1991

[51] Int. Cl.⁵ .......................................... H01L 27/14
[52] U.S. Cl. .................................... 257/188; 257/191; 257/201; 257/594
[58] Field of Search ................ 357/30 B, 30 H, 30 E, 357/30 R, 49, 50, 55, 56, 30 D, 16

[56] References Cited

U.S. PATENT DOCUMENTS

| | | | |
|---|---|---|---|
| 4,639,756 | 1/1987 | Rosbeck et al. | 357/55 |
| 4,868,622 | 9/1989 | Shigenaka | 357/30 B |
| 4,931,409 | 6/1990 | Nakajima et al. | 357/50 |
| 4,972,244 | 11/1990 | Buffet et al. | 357/30 B |
| 5,083,173 | 1/1992 | Yamada et al. | 357/55 |

FOREIGN PATENT DOCUMENTS

| | | | |
|---|---|---|---|
| 1-147875 | 6/1989 | Japan | 357/30 B |
| 1-201971 | 8/1989 | Japan | 357/30 B |

*Primary Examiner*—Andrew J. James
*Assistant Examiner*—Courtney A. Bowers
*Attorney, Agent, or Firm*—W. C. Schubert; W. K. Denson-Low

[57] ABSTRACT

A method for fabricating a plurality of semiconductor photodetectors and an array of same produced by the method. The method includes a first step of selectively removing semiconductor material to form a channel within a semiconductor material for physically isolating a first photodetector from a second photodetector, the semiconductor material having a characteristic energy bandgap. The method includes a second step of selectively increasing the carrier concentration of the semiconductor material within a bottom region of the channel for preventing minority charge carriers from diffusing under the channel from a region associated with the first photodetector to a region associated with the second photodetector. The step of selectively removing is accomplished by the steps of providing a patterned mask upon the semiconductor material and selectively removing the underlying semiconductor material through an opening within the mask. The step of selectively increasing the carrier concentration includes a step of ion implanting the semiconductor material through the opening within the mask.

11 Claims, 2 Drawing Sheets

INCIDENT INFRARED RADIATION

IMPLANT GUARDED MESA HAVING IMPROVED DETECTOR UNIFORMITY

FIELD OF THE INVENTION

This inventino relates generally to eletromagnetic radiation detectors and, in particular, to a method of fabricating an array of photovoltaic detectors and also to an array of same produced by the method.

BACKGROUND OF THE INVENTION

In commonly assigned U.S. Pat. No. 4,639,756, issued Jan. 27, 1987 and entitled "Graded Gap Inversion Layer Photodiode Array" J. P. Rosbeck and I. Kosai disclose a mesa-type photodiode array having U-shaped channels formed through an n-type capping layer, a p-type radiation absorbing base layer and partially into an underlying, more heavily doped, p-type buffer layer. The mesa structures are covered with a passivation layer having a fixed positive charge that inverts the underlying surface of the p-type base layer but not the more heavily doped buffer layer.

It is known that responsivity variations between individual photodetectors of such arrays are caused in part by variations in effective photodetector area. Variations of as little as plus or minus one micron may have a significant impact on response uniformity and, hence, may become a limiting factor in the usefulness of the array for certain applications.

This problem is especially apparent with photodetectors that are delineated by conventional mesa etching techniques. The inherently imprecise nature of the chemical etching process used to delineate the individual mesas and, hence, also the individual p-n junctions of the photodetectors typically results in the formation of ill-defined boundaries between adjacent photodetectors. Small variations in the etched structures result in variations in the effective optically sensitive areas of the photodetectors. One effect of the geometrical variation between mesa structures is that photocarriers created in a zone between two mesas may diffuse preferentially to either one of the p-n junctions contained within the two adjacent mesa structures. This results in the creation of non-uniformities in electrical output between the photodetectors.

By example, for a photovoltaic mercury-cadmium-telluride (HgCdTe) diode array, having a photosensitive layer that is 10 microns thick or greater, the geometric uniformity achieved through the conventional mesa etching process may exhibit an approximately one micron standard deviation. However, for the competing material platinum-silicide (PtSi), having only a 20 Angstrom thick photosensitive layer, the geometrical uniformity may exhibit only an approximately 0.1 micron to 0.2 micron standard deviation. This significant difference requires additional effort to correct for the larger non-uniformity that results from the use of the conventional mesa etch technique with HgCdTe.

The non-uniformity effect becomes more pronounced as the mesa structures are made smaller, thereby also reducing the effective optical area of each photodetector. In that it is often desirable to reduce the size of the mesa structures in order to increase the packing density and increase the optical resolution of the array, it can be appreciated that the induced photodetector non-uniformity may become a limiting factor that prevents the fabrication of a useable array below some minimum mesa structure size.

Although mesa etch processing techniques may eventually be improved, what is required, and what is thus one object of the invention to provide, is a method to precisely and uniformly delineate the optical areas of photovoltaic (PV) diodes in a mesa-type imaging array.

A further object of the invention is to provide an array of PV diodes, in a mesa-type imaging array, that exhibits a uniformity of diode response to incident electromagnetic radiation while also exhibiting a minimal degree of cross-talk between adjacent diodes.

Surrounding guard p-n junction have been previously employed to improve optical response uniformity. However, such guard junctions function by collecting rather than deflecting stray charge carriers. Thus, these conventional guard junctions act to reduce the effective optical area. This reduction in optical area is especially detrimental for densely-packed radiation detecting arrays.

It is thus an additional object of the invention is to provide improved detector uniformity without detrimentally impacting optical fill factor.

A still further object of the invention is to provide an array of PV diodes each of which is contained within an associated mesa structure, the array including integrally formed barriers between mesa structures to minimize the diffusion of charge carriers from a region associated with an optical collection area of one mesa structure to an adjacent mesa structure.

SUMMARY OF THE INVENTION

The foregoing and other problems are overcome and the objects of the invention are realized by a method of fabricating an array of PV detectors for improving a uniformity of response to incident radiation. The method is disclosed in the context of a mesa-etched PV detector array comprised of of either n-type or p-type Group II-VI semiconductor material, specifically HgCdTe, although the practice of the invention is not intended to be limited to only this specific material system. The method includes a step of ion-implanting an n+ region, or stripe, along the bottom of a channel etched into n-type material between individual mesas, the n+ region serving to define a geometrical and electrical boundary between adjacent photodiodes. The implant is self-aligned with the mesa, using the same mask for implant as is used for etching the mesa. For a p-type radiation detector material a p+ region on stripe is formed between adjacent mesa structures.

The implanted stripe functions as a minority carrier reflector to confine minority carriers to one side or the other of the stripe. In that the position of the stripe is more precisely defined than the mesa geometry itself, uniformity of response is improved among the photodetectors whose boundaries are defined by the stripe. The method also serves to reduce crosstalk between adjacent photodetectors.

One significant advantage of the invention is that it may be incorporated within present detector fabrication processes for relatively little additional cost.

In accordance with a method of the invention there is disclosed a method for fabricating a plurality of semiconductor photodetectors that are disposed upon a common substrate. The method includes a first step of selectively removing semiconductor material to form a channel within a semiconductor material for physically isolating a first photodetector from a second photodetector, the semiconductor material having a characteristic energy bandgap. The method includes a second step of selectively increasing the carrier concentration of the semiconductor material within a bottom region of the channel for minimizing the probability of charge carriers, generated by radiation that is absorbed within the semiconductor material, from diffusing under the channel from a region associated with the first photodetector to a region associated with the second photodetector.

Further in accordance with the invention there is disclosed an array of radiation detectors having precisely defined optical perimeters. The array includes a substrate, a first layer comprised of radiation absorbing Group II-VI n-type semiconductor material overlying the substrate, and a second layer comprised of Group II-VI p-type semiconductor material overlying the first layer. The first and the second layers are differentiated into a plurality of upstanding mesa-structures and are separated from one another by a plurality of intersecting channels that extend from a top surface of the array completely though the second layer of p-type semiconductor material and partially into the first layer of n-type semiconductor material. Each of the mesa structures contains an interface between the first and the second layers for forming therein a p-n photodiode junction. The array further includes, in accordance with the invention, an n+ semiconductor region disposed continuously along and within a bottom surface region of each of the intersecting channels. The n+ semiconductor region is contained within only the n-type material and has a carrier concentration, or potential barrier, that is sufficiently large for repelling minority charge carriers that would otherwise diffuse beneath a channel between two of the mesa structures.

Further in accordance with the invention the layer of n-type radiation absorbing material is compositionally graded through a thickness thereof for providing a bandgap energy distribution that constrains minority charge carriers to a surface region that underlies the p-type layer. As such, the effectiveness of the n+semiconductor region is enhanced.

BRIEF DESCRIPTION OF THE DRAWING

The above set forth and other features of the invention are made more apparent in the ensuing Detailed Description of the Invention when read in conjunction with the attached Drawing, wherein:

FIG. 2b is an enlarged view, not to scale, of a portion of the structure of FIG. 2a;

DETAILED DESCRIPTION OF THE INVENTION

Figure 1:
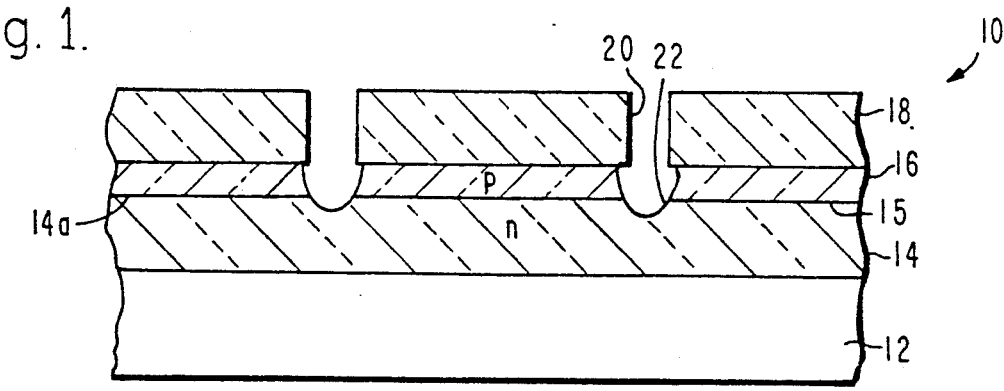
FIG. 1 shows in cross-section, not to scale, a portion of a HgCdTe array during the fabrication process and, specifically, immediately after the performance of a conventional mesa etch technique.

FIG. 1 is a cross-sectional view, not drawn to scale, of a portion of a HgCdTe array structure 10 during the fabrication process thereof and, specifically, immediately after the performance of a conventional mesa etch technique.

By example, the structure 10 as provided at this step of the fabrication process is comprised of a substrate 12 having a thickness of approximately 25 mils. The substrate 12 material is selected, for a back-side illuminated type of device, to be substantially transparent to wavelengths of interest. For infrared radiation applications the substrate may be comprised of cadmium-zinc-telluride (CdZnTe). The teaching of the invention is, however, not limited to only back-side illuminated devices.

Overlying substrate 12 is a radiation absorbing layer 14 comprised of n-type HgCdTe having a typical thickness of approximately 15 micrometers. Indium is one suitable dopant species and is provided at a concentration of approximately $2 \times 10^{15}$ atoms/cm$^3$.

Overlying layer 14 is a p-type HgCdTe layer having a thickness of approximately two micrometers. Arsenic is a suitable dopant species and is provided at a concentration of greater than $10^{17}$ atoms/cm$^3$. The interface of the n-layer 14 and the p-layer 16 defines a p-n diode junction 15 which, during operation, provides a detectable electrical signal having a magnitude that is a function of the amount of radiation absorbed within the layer 14.

One suitable method for forming the radiation absorbing layer 14 and the overlying p-type layer 16 is through Liquid Phase Epitaxy (LPE). Other fabrication methodologies may also be employed such as Vapor Phase Epitaxy (VPE), Metal-organic Chemical Vapor Deposition (MOCVD), Molecular Beam Epitaxy (MBE), Metal-organic Molecular Beam Epitaxy (MOMBE), and Chemical Beam Epitaxy (CBE).

The teaching of the invention is not limited to only radiation detectors having an n-type radiation absorbing layer. That is, the invention may also be practiced with detectors having a p-type radiation absorbing layer. For such n-on-p detectors the impurity concentrations and other parameters may be substantially the same as for the p-on-n configuration thus far described.

Overlying the p-type layer 16 is a masking layer 18 comprised of a conventional photoresist having a thickness of one to two micrometers. The masking layer 18 is photolithographically processed to form a grid-like pattern for defining the location and size of the desired mesa structures. The masking layer 18 is then selectively removed to form a plurality of openings 20 through which the underlying HgCdTe material of layer 16 and a portion of layer 14 is etched away.

A suitable wet chemical etching technique employs a bromine solution which isotropically etches the exposed HgCdTe material to form U-shaped grooves or channels 22. The depth of the etch is controlled such that the bottom of the channels 22 is located within the n-type layer 14. This both physically isolates and electrically isolates, to a first order, the intervening p-n junctions 15 one from another by insuring that each junction 15 is located within one of the resulting upstanding mesa structures. Due to the inherent impreciseness of the chemical etching step the channels 22 normally exhibit variations in width, depth and shape. These variations result in an imprecise geometrical definition of the resulting upstanding mesa structures that are formed between channels 22 as well as the optically sensitive boundary between adjacent diodes.

The processing of the structure 10 up to this point is conventional in nature. Normally, a next step would remove the masking layer 18 and subsequent processing, such as the application of contact metal and surface passivation, is then accomplished to complete the array.

Figure 2A:
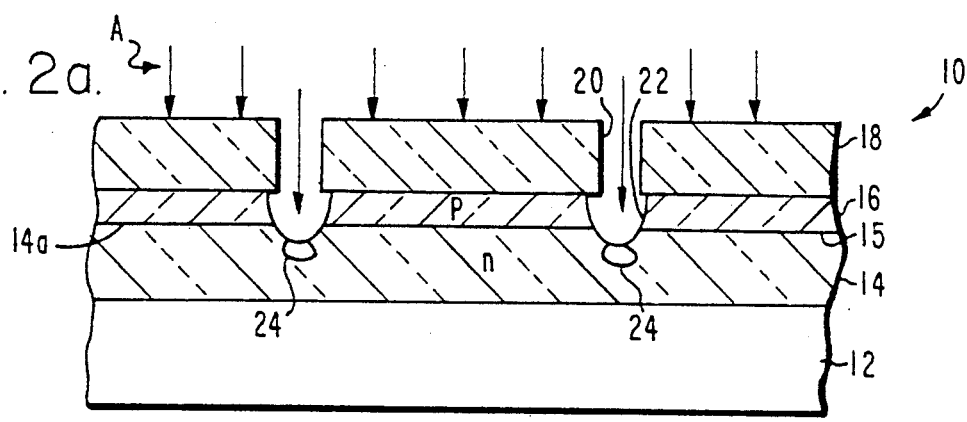
FIG. 2a shows in cross-section, not to scale, the portion of the HgCdTe array during the fabrication process and, specifically, the performance of an ion-implantation step to form a stripe-like n+ region along the bottom of the channel between adjacent mesas.

However, to overcome the deficiencies induced by the imprecise chemical etching step, and in accordance with a method step illustrated in FIG. 2a, the structure 10 undergoes an ion implantation step after the chemical etching step. The ion implantation step occurs with the photoresist mask 18 still in place and is thus self-aligning. The implanted ions are depicted by the arrows A in FIG. 2a As shown, the ions reach the underlying n-type layer 14 only through the opening 20 of mask 18 that are employed to also etch the channels 22.

Figure 2B:
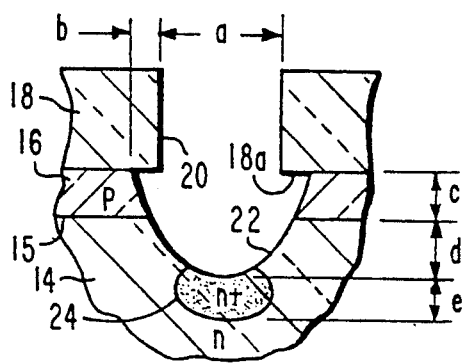

Referring to the enlarged view of FIG. 2b it can be seen that due to the isotropic nature of the etching process that the underlying HgCdTe material is also removed beneath the overlying photoresist mask 18. This undercutting creates an overhanging photoresist shelf or ledge 18a that is advantageously employed during the ion implantation step to insure that the implanted ions reach only the n-type material of the layer 14. The implanted ions form an n+ region 24 along and within only the bottom portion of the channel 22. This is important in that if the n+ region were to also contact the p-type material of layer 16 the performance of the p-n junction 15 would be significantly impaired.

Typical dimensions of the structure shown in FIG. 2b are as follows. The width (a) of the opening 20 within the photoresist mask 18 is approximately five micrometers. The width (b) of the overhang is approximately 2.5 micrometers for a channel 22 depth of approximately five micrometers (c+d). That is, the dimension (c) is approximately two micrometers, or the thickness of the p-type layer 16, and the depth (d) of the etch into the layer 14 is approximately three micrometers. For an implant energy of approximately 160 kV, a dosage of approximately $10^{12}$ atoms/cm$^2$, and for an implant species such as boron or hydrogen (protons) the depth (e) of the n+region 24 is approximately 0.5 to approximately 1.0 micrometers.

It is noted that the ion implantation step converts the n-type material of layer 14 to n+material predominantly through lattice damage phenomenon that is known to be associated with HgCdTe. Thus, dopant species such as boron or hydrogen can be employed. However, the implanted species may instead be a species selected to selectively increase the dopant concentration of the n-type material of layer 14. In this regard if the n-type material is substitutionally doped with indium then indium may also be employed as an implant species.

Figure 3:
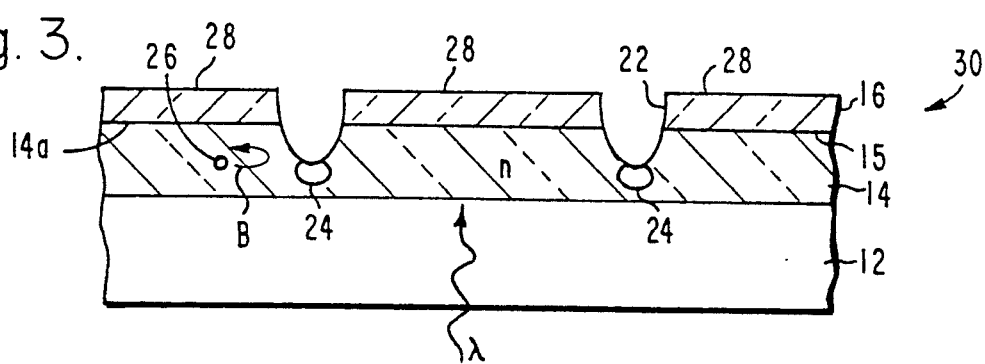
FIG. 3 shows in cross-section, not to scale, the portion of the HgCdTe array after fabrication.

FIG. 3 shows the structure having the layer 18 of photoresist removed and being operated as a photodetecting array 30. When irradiated by light having a wavelength (lambda) that is selectively absorbed as a function of the relative compositions of the Hg and Cd of the layer 14, charge carriers are generated. As indicated by the arrow B the n+ regions 24, due to their relatively higher carrier concentration than the surrounding n-type material, cause a shift in the Fermi level (FIGS. 5 and 6) which serves to reflect or repel minority charge carriers 26 that attempt to diffuse from an optical area associated with one mesa 28 to an adjacent mesa 28. Thus, the probability that the charge carriers are collected and detected by the nearest p-n junction is greatly increased. This beneficially reduces nonuniformities in detector outputs and significantly reduces crosstalk between adjacent detectors.

Figure 5:
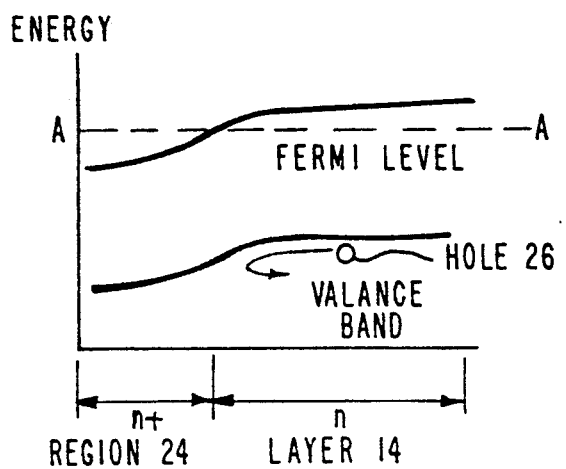
FIG. 5 is bandgap energy diagram showing the operation of the region of increased carrier concentration.

FIG. 5 is bandgap energy diagram showing the operation of one of the regions 24 of increased carrier concentration in repelling a minority carrier, or hole for the illustrated embodiment, that would otherwise diffuse beneath the groove between two adjacent mesas.

To further augment the operation of the regions 24 the layer 14 is preferably provided as a compositionally graded layer, in a manner similar to that described in commonly assigned U.S. patent application Ser. No. 07/490,011, filed Mar. 7, 1990, "Control of Optical Crosstalk Between Adjacent Photodetecting Regions", by P. Norton and C. Huang. By example, the layer 14 is comprised of Hg$_{(1-x)}$Cd$_x$Te where x has a value of approximately 0.2 at the surface 14a, for a ten micrometer thick layer 14, or a value of approximately 0.3 at the surface 14a, for a five micrometer thick layer 14. From the surface 14a, and going in a direction towards the substrate 12, the value of x varies with in a range of approximately 0.002 to approximately 0.02 per micrometer of thickness of the layer 14. This compositional grading profile may be approximately linear within the upper two thirds of the thickness of the layer 14 and non-linear within the lower one third of the layer 14 thickness that is nearest the substrate 12.

Figure 6:
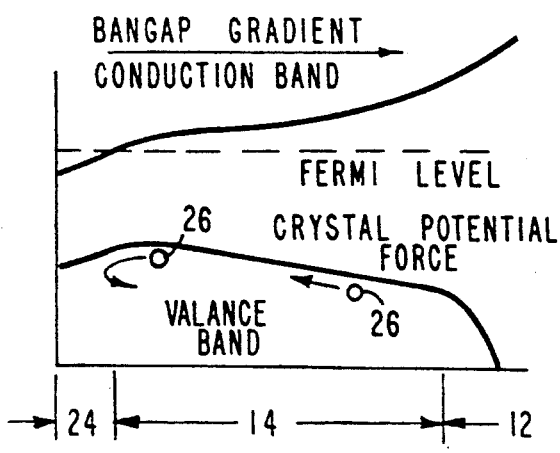
FIG. 6 is a bandgap energy diagram of a radiation detector having a radiation absorbing layer that is compositionally graded for constraining minority charge carriers to a top surface region.

As can be seen in the energy bandgap diagram of FIG. 6 the resulting bandgap gradient causes a reduction of the energy bandgap at the surface 14a as compared to the energy bandgap at the substrate 12 interface. This lowering of the energy bandgap also beneficially causes the minority charge upper surface 14a region of the layer 14.

Figure 4:
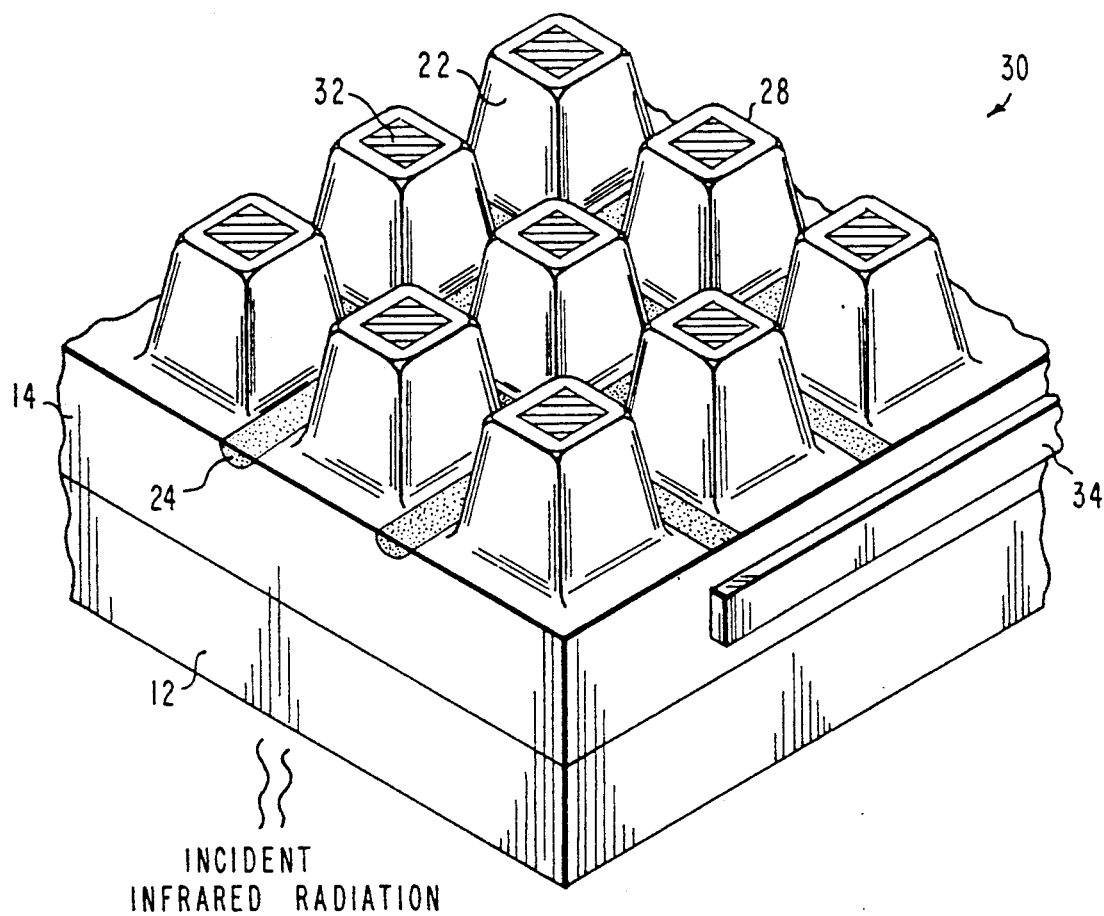
FIG. 4 is an elevational view, not to scale, showing a PV detector array constructed in accordance with the method of the invention.

Referring to FIG. 4 there is shown an elevational view of the mesa-type photodetecting array 30 for detecting radiation having wavelengths within the infrared spectrum. The array 30 of FIG. 4 is shown to have a plurality of contact metalization pads 32 each one of which is coupled to an underlying p-n junction 15 contained within a mesa 28. Common contact metalization 34 is also provided. Metalization 32 and 34 provides ohmic contacts for coupling the photodetectors to readout and electrical bias circuitry (not shown).

In accordance with the invention each of the mesas 28 can be seen to be surrounded by the n+ region 24. The n+ regions 24, being precisely located during fabrication by the positions of the openings 20 in the mask 18, precisely define the optical boundary or perimeter of each of the mesas 28. Thus, despite the fact the mesa structures themselves have variable boundaries created by the etching technique, their respective optically sensitive boundaries are precisely determined and are uniform in shape to within the limits of the precision of the openings 20 formed through the photoresist masking layer 18.

As mentioned above, a significant advantage of the method of the invention is that it is readily incorporated within present detector fabrication processes for relatively little additional cost. The practice of the invention beneficially improves the uniformity of mesa-type PV arrays. The resulting array 30 also exhibits a reduction in crosstalk between photodetectors, relative to a similar conventionally processed array.

In addition to the benefits discussed above the n+ implant regions 28 also reduce the impedance of the base layer 14. The reduction in impedance is especially beneficial for relatively large area arrays. The n+ implant regions 28 also improve the consistency of achieving good ohmic contacts to the relatively low-doped base layer 14 if the implant is positioned beneath the metal contact to the layer 14.

Although described above in the context of specific semiconductor materials having specific dimensions, conductivity type, specific dopant species, and specific implant species the practice of the invention is not intended to be so limited. For example, the teaching of the invention may also be applied to an n-on-p diode structure in HgCdTe so long as an appropriate implant species, such as As, is properly annealed to make it electrically active as a p+ region or stripe. Photodetectors comprised of Group III-V, Group IV-VI, and Group IV-IV materials may also benefically employ the teaching of the invention. As an example, photodetectors comprised of alloys of AlGaAsP may be fabricated in accordance with the above set-forth teaching.

Thus, while the invention has been particularly shown and described with respect to a preferred embodiment thereof, it will be understood by those skilled in the art that changes in form and details may be made therein without departing from the scope and spirit of the invention.

What is claimed is:

1. An array of photodetectors comprising:
   a substrate;
   a first layer comprised of radiation absorbing Group II-VI semiconductor material overlying the substrate, the first layer having a first conductivity type;
   a second layer comprised of Group II-VI semiconductor material overlying the first layer, the second layer having a second conductivity type that is opposite that of the first layer, the first second layers being differentiated into a plurality of upstanding mesa-structures separated from one another by a plurality of intersecting channels that extend from a top surface of the array completely through the second layer of semiconductor material and partially into the layer of semiconductor material, each of the mesa structures containing an interface between the first and the second layers for forming therein a p-n photodiode junction and having disposed thereon a first contact metallization pad in contact with the second layer;
   a semiconductor region disposed continuously along and within a bottom surface region of each of the intersecting channels, the semiconductor region being contained within only the material of the first layer and having a carrier concentration that is sufficiently large for repelling minority charge carriers that would otherwise diffuse beneath the channel; and
   a common second contact metallization pad for the array of photodetectors, said common contract metallization pad in contact with said first layer lateral to said array.

2. An array of photodetectors as set forth in claim 1 wherein the first and the second layers are each comprised of HgCdTe.

3. An array of photodetectors as set forth in claim 1 wherein the first layer is doped at a concentration of approximately $2 \times 10^{15}$ donor atoms/cm$^3$ and wherein the second layer is doped at a level of greater than $10^{17}$ acceptor atoms/cm$^3$.

4. An array of photodetectors as set forth in claim 1, wherein each of the channels has a depth of approximately five micrometers.

5. An array of photodetectors as set forth in claim 1 wherein the substrate is comprised of a material that is substantially transparent to radiation having wavelengths of interest.

6. An array of photodetectors set forth in claim 5 wherein the wavelengths of interest include at least a portion of the infrared spectrum.

7. An array of photodetectors as set forth in claim 1 wherein the first semiconductor layer has a bandgap energy that varies through a thickness of the first semiconductor layer such that the bandgap is narrowest at the surface of the first semiconductor layer that underlies the second semiconductor layer and is closest to it.

8. An array of photodetectors as set forth in claim 1 wherein the first layer is doped at a concentration of approximately $2 \times 10^{15}$ acceptor atoms/cm$^3$ and wherein the second layer is doped at a level of greater than $10^{17}$ donor atoms/cm$^3$.

9. An array of photodetectors as set forth in claim 1 wherein the second layer of semiconductor material is comprised of p-type HgCdTe, wherein the first layer of semiconductor material is comprised of n-type HgCdTe, and wherein the semiconductor region is an n+ region within the n-type HgCdTe.

10. An array of photodetectors as set forth in claim 1 wherein the second layer of semiconductor material is comprised of n-type HgCdTe, wherein the first layer of semiconductor material is comprised of p-type HgCdTe, and wherein semiconductor region is a p+ region within the p-type HgCdTe.

11. An array of photodetectors as set forth in claim 1 wherein the first semiconductor layer is comprised of $Hg_{(x-1)}Cd_xTe$, and wherein the value of x varies as a function of thickness of the first layer within a range of approximately 0.002 to approximately 0.02 per micrometer of thickness of the first layer such that a bandgap energy of the first semiconductor layer is narrowest at the surface of the first semiconductor layer that underlies the second semiconductor layer and is closest to it.

* * * * *